United States Patent [19]

Schoenberg

[11] Patent Number: 5,150,176
[45] Date of Patent: Sep. 22, 1992

[54] PN JUNCTION SURGE SUPPRESSOR STRUCTURE WITH MOAT

[75] Inventor: Mark Schoenberg, Chandler, Ariz.
[73] Assignee: Motorola, Inc., Schaumburg, Ill.
[21] Appl. No.: 834,746
[22] Filed: Feb. 13, 1992
[51] Int. Cl.[5] .................................. H01L 29/90
[52] U.S. Cl. ................................ 357/13; 357/56; 357/20; 357/90
[58] Field of Search ............... 357/13, 20, 90, 13 Z, 357/13 U, 13 O, 13 PT, 13 LM, 13 R, 56, 4

[56] References Cited

U.S. PATENT DOCUMENTS

| | | | |
|---|---|---|---|
| 4,323,909 | 4/1982 | Valdmann | 357/13 |
| 4,484,206 | 11/1984 | Moroshima et al. | 357/13 |
| 4,648,174 | 3/1987 | Temple et al. | 29/578 |
| 4,720,734 | 1/1988 | Amemiya et al. | 357/13 X |
| 4,870,467 | 9/1989 | Boland et al. | 357/13 |
| 4,891,685 | 1/1990 | Einthoven et al. | 357/13 X |
| 4,927,772 | 5/1990 | Arthur et al. | 437/6 |
| 5,093,693 | 3/1992 | Abbas et al. | 357/13 |

FOREIGN PATENT DOCUMENTS

| | | | |
|---|---|---|---|
| 53-97386 | 8/1978 | Japan | 357/13 |
| 9001217 | 2/1990 | PCT Int'l Appl. | 357/13 |

OTHER PUBLICATIONS

Ahmad et al., "A Proposed Planar Junction Structure with Near-Ideal Breakdown Characteristics," *IEEE Electron Device Letters*, vol. EDL-6, No. 9, Sep. 1985, pp. 465–467.

Georgescu et al., "Planar Termination for High-Voltage P-N Junctions," *Solid-State Electronics*, vol. 29, No. 10, pp. 1035–1039, 1986.

Hwang et al., "Breakdown Voltage Optimization of Silicon P-T-2 Planar Junction Diodes," IEEE Transactions on Electron Devices, vol. ED-31, No. 9, Sep. 1984, pp. 1126–1135.

Primary Examiner—William Mintel
Attorney, Agent, or Firm—Harry A. Wolin

[57] ABSTRACT

A surge suppressor semiconductor structure includes a semiconductor substrate of a first conductivity type and an epitaxial semiconductor layer of a second conductivity type disposed thereon. A region in the epitaxial layer has a higher dopant concentration than the remainder of the epitaxial layer. This creates a junction at an interface of the substrate and the highly doped region of the epitaxial layer. A moat is disposed about the epitaxial layer and a portion of the substrate and dielectric material is disposed in the moat and on the epitaxial layer. Contacts are then formed to contact both the highly doped region of the epitaxial layer and the substrate.

11 Claims, 2 Drawing Sheets

PN JUNCTION SURGE SUPPRESSOR STRUCTURE WITH MOAT

FIELD OF THE INVENTION

This invention pertains, in general, to the semiconductor arts and more particularly to a surge suppressor structure and method.

BACKGROUND OF THE INVENTION

Surge suppressor devices are well known and widely utilized in the semiconductor arts. These devices, typically discrete devices, are employed to suppress transients of high currents in a power supplies or the like before the transients reach and potentially damage an integrated circuit or similar structure. Surge suppressor devices find uses in both high and low voltage applications although they are particularly useful for low voltage applications of 7 volts or less.

It is well known to employ discrete reference diodes as surge suppression devices in low voltage applications. These reference diodes are planar structures and typically fabricated in single crystal silicon substrates. The diodes are often boron doped and require an extremely steep junction gradient. They have extremely shallow junction depths (usually of less than 1 micrometer) and their highest dopant concentration is near the surface of the device. Accordingly, breakdown occurs very near the device surface. This causes the diodes to be vulnerable to oxide/silicon interface states and/or dominant silicon trapping states. This results in high leakage.

Surface defects often caused by chemical/mechanical polishing, implanting steps and the like are prevalent in shallow junction reference diodes. The surface defects in the diodes cause leakage and form "hot spots" at the areas where the defects are located. These "hot spots" cause the diode junction to burn up which keeps the diode from suppressing transients. Hence, low surge capability.

It has previously been attempted to use a fast diffusing dopant such as aluminum to create diodes having a deeper junction. However, the aluminum causes significant material defects within the silicon substrate. Large densities of material defects and other interstitials within the substrate result in excessive reverse leakage and low surge capability.

U.S. Pat. No. 4,484,206 issued to Moroshima et al. on Nov. 20, 1984 and titled "Zener Diode With Protective PN Junction Portions" teaches a zener diode that exhibits a high endurance characteristic against surge voltages. This planar device is fabricated with the use of 2 masks to implant P regions of differing dopant concentrations. A shallow P+ region will have sub-surface breakdown but the shallow junction is vulnerable to charging effects at silicon/oxide interfaces as well as substrate defects.

In their paper titled "A Proposed Planar Junction Structure With Near-Ideal Breakdown Characteristics", *IEEE Electron Device Letters*, Vol. EDL-6 No. 9, September, 1985, Ahmad et al. teach the addition of a low-concentration P type pocket around the edge region of a P+—N planar junction to improve electric field distribution. The planar structure taught includes a shallow P+ region, shallower than the low-concentration P pocket. These P regions are formed in a substrate, not in epitaxial material. This structure is vulnerable to material defects in the substrate as well as charge effects.

Accordingly, it would be highly desirable to have a surge suppression structure having good surge capability, not vulnerable to substrate defects and capable of operating at relatively low voltages.

SUMMARY OF THE INVENTION

A semiconductor structure useful for surge suppression comprises a semiconductor substrate of a first conductivity type having first and second surfaces. An epitaxial semiconductor layer of a second conductivity type is disposed on the first surface of the substrate. A region of high dopant concentration is formed in the epitaxial layer resulting in a junction at an interface of the substrate and the highly doped region of the epitaxial layer. A moat is disposed about the epitaxial layer and a portion of the substrate and dielectric material is disposed on the epitaxial layer and in the moat. Contacts are electrically coupled the highly doped region of the epitaxial layer and the substrate.

DETAILED DESCRIPTION OF THE DRAWINGS

Figure 1:
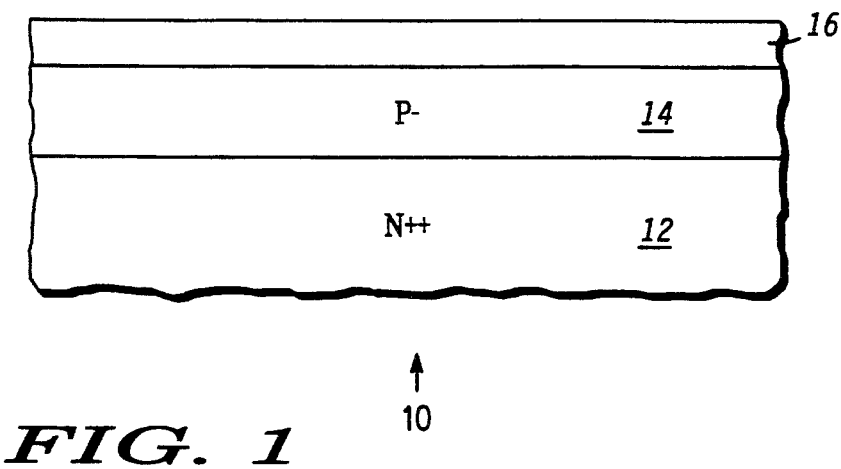
FIGS. 1–4 are highly enlarged cross-sectional views of a semiconductor device during various stages of processing.

FIGS. 1–4 are highly enlarged cross-sectional views of a semiconductor structure 10 during various stages of processing. Referring specifically to FIG. 1, semiconductor structure 10 includes substrate 12. Substrate 12 comprises single crystal silicon herein and has an N++ conductivity type. Substrate 12 should have a resistivity of less than 0.01 ohm cm, preferably a resistivity of less than 0.006 ohm cm and most preferably a resistivity of less than 0.002 ohm cm. Although specific material, conductivity type and resistivities are set forth herein, it should be understood that substrate 12 may comprise semiconductor materials, conductivity type and resistivities other than those specifically set forth herein.

An epitaxial layer 14 is formed on substrate 12. Epitaxial layer 14 also comprises silicon in this embodiment and has a thickness on the order of 1.5 to 3.0 micrometers and preferably, a thickness on the order of 2 micrometers. Epitaxial layer 14 is in situ doped and has a P-conductivity type. The resistivity of epitaxial layer 14 is on the order of 0.05 to 0.3 ohm cm, preferably on the order of 0.1 to 0.2 ohm cm and most preferably 0.15 ohm cm. It is desireable that epitaxial layer 14 be formed fairly rapidly so that an abrupt junction is established. A deposition rate on the order of 1 micrometer/minute is preferred.

A dielectric layer 16 is formed on epitaxial layer 14. Dielectric layer 16 comprises silicon dioxide in this embodiment although other dielectric materials may be employed. Dielectric layer 16 may vary in thickness although in the embodiment shown herein, it has a thickness on the order of 2000 angstroms and is thermally formed by methods well known in the art.

Figure 2:
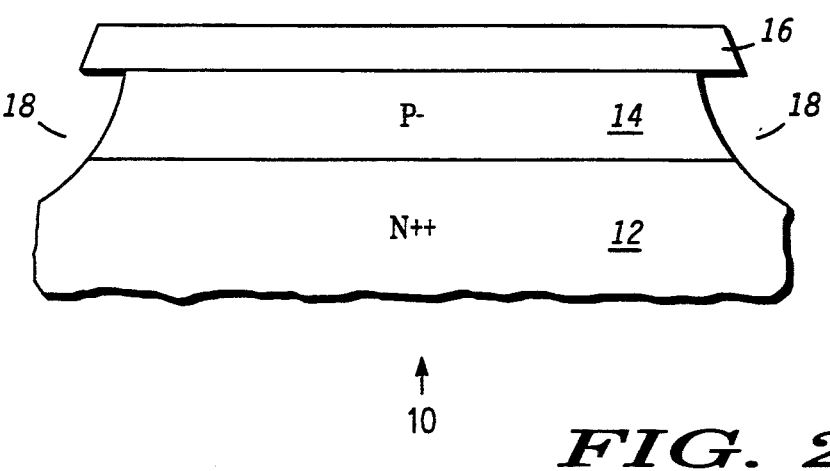

Referring specifically to FIG. 2. Following the formation of dielectric layer 16, a moat 18 is formed about epitaxial layer 14 and a portion of substrate 12. Moat 18 is formed by forming a moat photoresist layer (not shown) on the surface of dielectric layer 16. Moat 18 is then formed by etching through dielectric layer 16 and then through silicon epitaxial layer 14 and silicon substrate 12. Various etch chemistries that etch both silicon dioxide and silicon are well known in the art.

Moat 18 preferably has a depth through dielectric layer 16, epitaxial layer 14 and substrate 12 on the order of 5 to 15 micrometers and a preferable depth on the order of 10 micrometers. After moat 18 has been etched, the moat photoresist is removed. As shown in FIG. 2, dielectric layer 16 overhangs epitaxial layer 14 around moat 18. This is merely a result of specific etch chemistries and it is not essential that the overhang exists.

Figure 3:
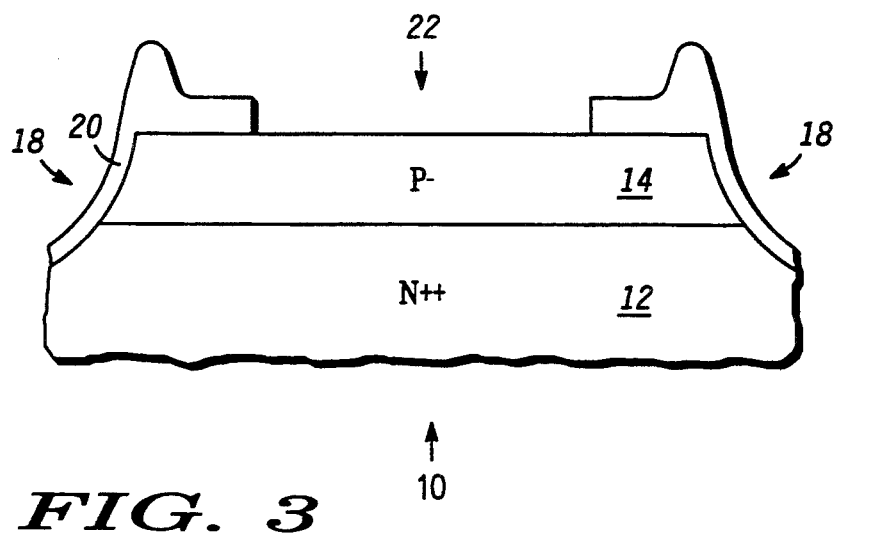

Referring specifically to FIG. 3. Following the formation of moat 18, moat oxide 20 is formed in moat 18 and on the surface of epitaxial layer 14. Moat oxide 20 is formed by thermal oxidation and also includes the remaining portions of dielectric layer 16 disposed on epitaxial layer 14. Moat oxide 20 may vary in thickness although a thickness on the order of 8000 angstroms in moat 18 itself is preferred. Once moat oxide 20 has been formed, a window 22 is formed through the combination of moat oxide 20 disposed on the surface of epitaxial layer 14. Window 22 is formed by methods well known in the art including a photoresist mask (not shown) and an oxide etch. This is followed by removal of the photoresist mask. Window 22 exposes a portion of the surface of epitaxial layer 14.

Figure 4:
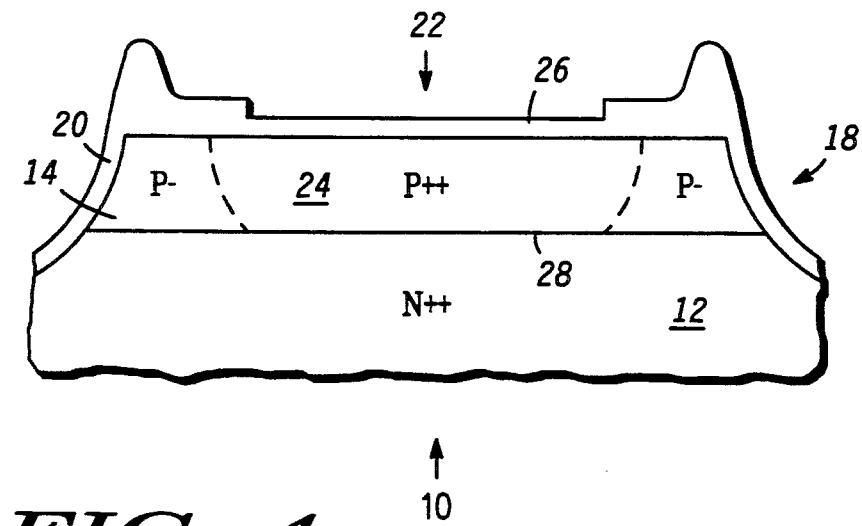

Now referring specifically to FIG. 4. Following the formation of window 22, a pre-implant oxide (not shown) is formed in window 22. The pre-implant oxide has a preferable thickness on the order of 950 angstroms although it may vary. Following the formation of the pre-implant oxide, a highly doped region 24 is formed in epitaxial layer 14. Highly doped region 24 is formed by implanting boron or another suitable P type dopant through window 22 into epitaxial layer 14. Highly doped region 24 has a surface dopant concentration on the order of $10^{19}$ to $10^{20}$ atoms cm$^{-3}$, preferably a surface dopant concentration on the order of $1 \times 10^{19}$ to $5 \times 10^{20}$ atoms cm$^{-3}$ and most preferably a surface dopant concentration on the order of $1 \times 10^{20}$ atoms cm$^{-3}$. The dopant concentration of highly doped region 24 is graded so that it has a dopant concentration near the surface of substrate 12 on the order of $10^{17}$ atoms cm$^{-3}$, preferably a dopant concentration on the order of $1 \times 10^{17}$ to $7 \times 10^{17}$ atoms cm$^{-3}$ and most preferably, a dopant concentration on the order of $3 \times 10^{17}$ to $5 \times 10^{17}$ atoms cm$^{-3}$.

After the implantation of highly doped region 24, an oxide layer 26 is formed over the exposed surface of epitaxial layer 24. As shown, oxide layer 26 has a thickness on the order of 7000 angstroms and may be deposited by a well known TEOS method. It should be understood that the deposition of oxide layer 26 will occur on the entire surface of structure 10 and not only in window 22.

Following the deposition of oxide layer 26, structure 10 is annealed for junction redistribution and densification. This allows the formation of an active junction 28 at or near the interface of highly doped region 24 and substrate 12. During this junction redistribution/densification step, P type impurities from highly doped region 24 an N type impurities from substrate 12 redistribute along the interface of region 24 and substrate 12. This is well understood by one of skill in the art. After the junction redistribution/densification step, active junction 28 will have a junction gradient on the order of $10^{24}$ atoms cm$^{-4}$, preferably a junction gradient on the order of $5 \times 10^{23}$ to $5 \times 10^{24}$ atoms cm$^{-4}$ and most preferably, a junction gradient on the order of $1.5 \times 10^{24}$ atoms cm$^{-4}$.

Figure 5:
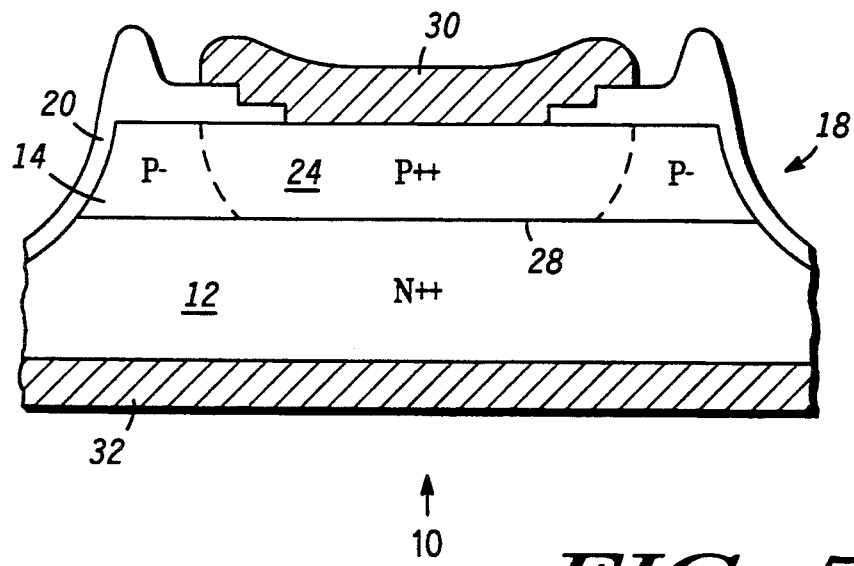
FIG. 5 is a highly enlarged cross-sectional view of the semiconductor device of FIGS. 1–4.

FIG. 5 is a highly enlarged cross-sectional view of semiconductor structure 10 after processing has been completed. Following the junction redistribution/densification step, a contact 30 contacting highly doped region 24 and a contact 32 contacting substrate 12 are formed. Contact 30 is formed by forming a photoresist mask, removing oxide layer 26 from window 22 (see FIG. 4), removing the contact photoresist and evaporating metal on the surface of structure 10. Although many metals are well known for use as contacts and may be employed, contact 30 comprises a titanium/nickel/silver metal scheme comprising on the order of 1000 angstroms titanium, 2000 angstroms nickel and 8000 angstroms silver. Following the evaporation of these metals, the metals are patterned as is well known in the art to form contact 30.

Contact 32 is formed following the backside thinning of substrate 12. After substrate 12 has been thinned to a predetermined thickness, a titanium/nickel/silver metal scheme is evaporated thereon. This metal scheme preferably has the same metal layer thickness as contact 30, hence forming contact 32.

Structure 10 disclosed herein is excellent for surge suppression, particularly in low voltage applications wherein the voltages are 7 volts or less. The portions of epitaxial layer 14 surrounding highly doped region 24 act as a protective guard ring. This P− epitaxial material has a breakdown voltage greatly exceeding that of P+ highly doped region 24. This allows substantial reduction or elimination of the effect of silicon dioxide/silicon interface states and silicon trapping states. This is achieved by forcing a bulk breakdown of the active junction region. Accordingly, the effects of the charges within any oxide is minimal. Because epitaxial layer 14 is used, there are no significant material defects to cause "hot spots". The epitaxial material has a much lower defect density than a ground back substrate.

Structure 10 has a relatively deep active junction 28. It should be understood that the depth of active junction 28 is approximately the same as the thickness of epitaxial layer 14. The relatively deep junction allows for greater surge capability. Structure 10 also has an extremely steep junction gradient. The steep junction gradient allows for very low breakdown voltages that make structure 10 ideal for low voltage surge suppression. Structure 10 also uses moat 18 isolation that extends into the heavily doped substrate 12. Moat 18 spreads out the high electric field within the substrate further increasing surge capability. The spreading of the electric field also helps eliminate "hot spots".

Thus it is apparent that there has been provided, in accordance with the invention, an improved semiconductor structure useful for surge suppression. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A semiconductor structure comprising:
   a semiconductor substrate of a first conductivity type having first and second surfaces;

an epitaxial semiconductor layer of a second conductivity type disposed on said first surface of said substrate;

a region in said epitaxial layer having a higher dopant concentration than the remainder of said epitaxial layer;

a junction at an interface of said substrate and said highly doped region of said epitaxial layer;

a moat disposed about said epitaxial layer and a portion of said substrate;

dielectric material disposed on said epitaxial layer and in said moat; and contacts contacting said highly doped region of said epitaxial layer and said substrate.

2. The structure of claim 1 wherein the substrate and epitaxial layer comprise silicon.

3. The structure of claim 2 wherein the first conductivity type is N and the second conductivity type is P.

4. The structure of claim 3 wherein the dielectric material comprises an oxide.

5. The structure of claim 3 wherein the epitaxial layer has a thickness on the order of 1.5 to 3.0 micrometers.

6. The structure of claim 5 wherein the substrate has a resistivity on the order of less than 0.01 ohm cm, the highly doped region of the epitaxial layer has a surface dopant concentration on the order of $10^{19}$ to $10^{20}$ atoms cm$^{-3}$ and a dopant concentration near the junction on the order of $10^{17}$ atoms cm$^{-3}$, the junction has a gradient on the order of $10^{24}$ atoms cm$^{-4}$ and the remainder of the epitaxial layer has a resistivity on the order of 0.05 to 0.3 ohm cm.

7. A surge suppressor semiconductor structure comprising:

a silicon substrate of a first conductivity type having first and second surfaces;

a silicon epitaxial layer of a second conductivity type and having a thickness on the order of 1.5 to 3.0 micrometers disposed on said first surface of said substrate;

a central region in said epitaxial layer having a higher dopant concentration than the remainder of said epitaxial layer;

a junction at the interface of said central region of said epitaxial layer and said substrate;

a moat disposed about said epitaxial layer and a portion of said substrate;

oxide disposed on said epitaxial layer and in said moat;

a contact disposed on and electrically coupled to said central region of said epitaxial layer; and a contact disposed on and electrically coupled to said second surface of said substrate.

8. The structure of claim 7 wherein the first conductivity type is N and the second conductivity type is P.

9. The structure of claim 8 wherein the substrate has a resistivity on the order of less than 0.01 ohm cm, the central region of the epitaxial layer has a surface dopant concentration on the order of $1 \times 10^{19}$ to $5 \times 10^{20}$ atoms cm$^{-3}$ and a dopant concentration near the junction on the order $1 \times 10^{17}$ to $7 \times 10^{17}$ atoms cm$^{-3}$, the junction has a gradient on the order of $5 \times 10^{23}$ to $5 \times 10^{24}$ atoms cm$^{-4}$ and the remainder of said epitaxial layer has a resistivity on the order of 0.1 to 0.2 ohm cm.

10. The structure of claim 9 wherein the substrate has a resistivity on the order of 0.002 ohm cm, the thickness of the epitaxial layer is on the order of 2.0 micrometers, the central portion of the epitaxial layer has a surface dopant concentration on the order of $1 \times 10^{20}$ atoms cm$^{-3}$ and a dopant concentration near the junction on the order of $3 \times 10^{17}$ to $5 \times 10^{17}$ atoms cm$^{-3}$, the junction has a gradient on the order of $1.5 \times 10^{24}$ atoms cm$^{-4}$ and the remainder of said epitaxial layer has a resistivity on the order of 0.15 ohm cm.

11. The structure of claim 9 wherein the contacts comprise titanium/nickel/silver.

* * * * *